(12) United States Patent
Lee et al.

(10) Patent No.: US 6,995,448 B2
(45) Date of Patent: Feb. 7, 2006

(54) SEMICONDUCTOR PACKAGE INCLUDING PASSIVE ELEMENTS AND METHOD OF MANUFACTURE

(75) Inventors: Sang Ho Lee, Seoul (KR); Jun Young Yang, Seoul (KR); Seon Goo Lee, Kyonggi-do (KR); Jong Hae Hyun, Seoul (KR); Choon Heung Lee, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 269 days.

(21) Appl. No.: 10/107,656

(22) Filed: Mar. 25, 2002

(65) Prior Publication Data

US 2002/0140085 A1   Oct. 3, 2002

(30) Foreign Application Priority Data

Apr. 2, 2001   (KR) ................. 2001-17449

(51) Int. Cl.
*H01L 29/00*   (2006.01)
*H01L 23/02*   (2006.01)

(52) U.S. Cl. .............. 257/516; 257/531; 257/532; 257/536; 257/535; 257/927

(58) Field of Classification Search ........... 257/724, 257/787, 723, 667, 782–784, 516, 532, 535, 257/927, 531, 536; 361/763
See application file for complete search history.

(56) References Cited

U.S. PATENT DOCUMENTS

| | | | |
|---|---|---|---|
| 4,143,385 A | * | 3/1979 | Miyoshi et al. ............... 257/82 |
| 4,754,366 A | * | 6/1988 | Hernandez ............... 361/306.2 |
| 4,783,646 A | * | 11/1988 | Matsuzaki ............... 340/572.5 |
| 5,095,402 A | * | 3/1992 | Hernandez et al. ....... 361/306.2 |
| 5,200,364 A | * | 4/1993 | Loh ............................. 29/827 |
| 5,272,590 A | * | 12/1993 | Hernandez ............... 361/306.2 |
| 5,309,324 A | * | 5/1994 | Herandez et al. ........... 361/734 |
| 5,347,429 A | | 9/1994 | Kohno et al. |
| 5,355,283 A | * | 10/1994 | Marrs et al. ................ 361/760 |
| 5,463,253 A | | 10/1995 | Waki et al. |
| 5,474,957 A | | 12/1995 | Urushima |
| 5,474,958 A | | 12/1995 | Djennas et al. |
| 5,581,498 A | | 12/1996 | Ludwig et al. |
| 5,583,376 A | * | 12/1996 | Sickler et al. .............. 257/702 |

(Continued)

FOREIGN PATENT DOCUMENTS

JP   01245588   *   9/1989

(Continued)

*Primary Examiner*—Laura M. Schillinger
*Assistant Examiner*—James M. Mitchell
(74) *Attorney, Agent, or Firm*—Weiss, Moy & Harris, P.C.

(57) ABSTRACT

A semiconductor package including passive elements and a method of manufacturing provide reduced package size, improved performance and higher process yield by mounting the passive elements beneath the semiconductor die on the substrate. The semiconductor die may be mounted above the passive elements by mechanically bonding the semiconductor die to the passive elements, mounting the passive elements within a recess in the substrate or mounting the semiconductor using an adhesive retaining wall on the substrate that protrudes above and extends around the passive elements. The recess may include an aperture through the substrate to vent the package to the outside environment or may comprise an aperture through the substrate and larger than the semiconductor die, permitting the encapsulation to entirely fill the aperture, covering the die and the passive elements to secure them mechanically within the package.

13 Claims, 6 Drawing Sheets

U.S. PATENT DOCUMENTS

| | | | |
|---|---|---|---|
| 5,656,856 A * | 8/1997 | Kweon | 257/686 |
| 5,663,594 A * | 9/1997 | Kimura | 257/666 |
| 5,674,785 A | 10/1997 | Akram et al. | |
| 5,729,053 A * | 3/1998 | Orthmann | 257/724 |
| 5,731,632 A * | 3/1998 | Kozono | 257/717 |
| 5,739,581 A | 4/1998 | Chillara et al. | |
| 5,739,585 A | 4/1998 | Akram et al. | |
| 5,783,870 A * | 7/1998 | Mostafazadeh et al. | 257/791 |
| 5,798,014 A | 8/1998 | Weber | |
| 5,834,832 A * | 11/1998 | Kweon et al. | 257/676 |
| 5,835,355 A | 11/1998 | Dordi | |
| 5,847,445 A * | 12/1998 | Wark et al. | 257/669 |
| 5,856,937 A * | 1/1999 | Chu et al. | 365/51 |
| 5,874,770 A * | 2/1999 | Saia et al. | 257/536 |
| 5,889,325 A * | 3/1999 | Uchida et al. | 257/724 |
| 5,894,108 A | 4/1999 | Mostafazadeh et al. | |
| 5,903,052 A | 5/1999 | Chen et al. | |
| 5,952,611 A | 9/1999 | Eng et al. | |
| 5,963,429 A * | 10/1999 | Chen | 361/764 |
| 6,013,948 A | 1/2000 | Akram et al. | |
| 6,034,427 A | 3/2000 | Lan et al. | |
| 6,060,778 A | 5/2000 | Jeong et al. | |
| 6,072,243 A | 6/2000 | Nakanishi | |
| 6,081,030 A * | 6/2000 | Jaouen et al. | 257/728 |
| 6,091,144 A * | 7/2000 | Harada | 257/724 |
| 6,122,171 A | 9/2000 | Akram et al. | |
| 6,127,724 A * | 10/2000 | DiStefano | 257/675 |
| 6,127,833 A | 10/2000 | Wu et al. | |
| 6,160,705 A | 12/2000 | Stearns et al. | |
| 6,172,419 B1 | 1/2001 | Kinsman | |
| 6,184,463 B1 | 2/2001 | Panchou et al. | |
| 6,214,641 B1 | 4/2001 | Akram | |
| 6,215,193 B1 * | 4/2001 | Tao et al. | 257/777 |
| 6,232,660 B1 * | 5/2001 | Kakimoto et al. | 257/728 |
| 6,235,554 B1 | 5/2001 | Akram et al. | |
| 6,369,435 B1 * | 4/2002 | Igel | 257/415 |
| 6,395,578 B1 | 5/2002 | Shin et al. | |
| 6,400,576 B1 * | 6/2002 | Davidson | 361/763 |
| 6,417,026 B2 * | 7/2002 | Gotoh et al. | 438/108 |
| 6,452,278 B1 * | 9/2002 | DiCaprio et al. | 257/777 |
| 6,478,228 B1 * | 11/2002 | Ikefuji et al. | 235/492 |
| 6,545,347 B2 * | 4/2003 | McClellan | 174/260 |
| 6,546,620 B1 * | 4/2003 | Juskey et al. | 29/840 |
| 6,635,970 B2 * | 10/2003 | Lasky et al. | 257/777 |
| 6,774,473 B1 * | 8/2004 | Shen | 257/686 |
| 6,870,248 B1 * | 3/2005 | Shibata | 257/686 |
| 2001/0019292 A1 * | 9/2001 | Funahara et al. | 331/68 |
| 2001/0030059 A1 * | 10/2001 | Sugaya et al. | 174/256 |
| 2002/0027773 A1 * | 3/2002 | Davidson | 361/763 |
| 2002/0028533 A1 * | 3/2002 | Tang et al. | 438/106 |
| 2002/0086500 A1 * | 7/2002 | Wu et al. | 438/455 |
| 2002/0145180 A1 * | 10/2002 | Terui et al. | 257/666 |
| 2003/0038374 A1 * | 2/2003 | Shim et al. | 257/777 |

FOREIGN PATENT DOCUMENTS

| | | | |
|---|---|---|---|
| JP | 404062866 | * | 2/1992 |
| JP | 05136323 A | | 6/1993 |
| JP | 406132469 | * | 5/1994 |
| JP | 406132472 | * | 5/1994 |
| JP | 09045818 | * | 2/1997 |
| JP | 10-173085 | | 6/1998 |
| JP | 11-214578 | * | 8/1999 |

* cited by examiner

SEMICONDUCTOR PACKAGE INCLUDING PASSIVE ELEMENTS AND METHOD OF MANUFACTURE

FIELD OF THE INVENTION

The present invention relates generally to integrated circuit packaging and more specifically, to a method and assembly for packaging integrated circuit dies along with passive elements.

BACKGROUND OF THE INVENTION

In general, electronic elements are either active or passive elements. Active elements typically include a non-linear feature and passive elements generally never operate non-linearly while operating in their linear region. A typical example of an active element is a semiconductor die such as a transistor, an Integrated Circuit (IC) or a similar device. A typical example of a passive element is a capacitor, a resistor, an inductor or a similar device.

A passive element is usually an external device electrically connected to a semiconductor package and serves to assist the operation the active element (the semiconductor die) by performing a filtering functions or other similar functions. However, when a passive element is mounted on the periphery of a semiconductor package as mentioned above, the area of the circuit is increased and the mounting density of semiconductor packages is greatly lowered.

To reduce the area consumed by passive elements, a structure and method of manufacture for semiconductor packages have been recently proposed in which a passive element is directly mounted on a substrate, which is a structural element of the semiconductor package. The proposed structure will be described below.

A substrate having multiple electrically conductive patterns formed on a top and bottom surface is provided. A semiconductor die is then bonded to the center of the top surface of the substrate. Multiple passive elements are mounted on the electrically conductive patterns located at the periphery of the semiconductor die and bond pads of the semiconductor die are electrically connected to the electrically conductive patterns of the top surface of the substrate by conductive connector (for example, a conductive wire). Also, multiple conductive balls are fused to the electrically conductive patterns of the bottom surface of the substrate. Finally, an encapsulant is applied over the entire top surface of the substrate so that the semiconductor die, the conductive connector and the passive elements are protected from the external environment.

The passive elements can be mounted on the electrically conductive patterns of the top surface of the substrate using SMT (Surface Mount Technology) or THT (Through Hole Technology), which are typically soldered electrical and mechanical connections.

However, the above-described semiconductor package has various disadvantages. First, since the passive elements are mounted on the substrate located at the periphery of the semiconductor die, the area of the substrate must be increased substantially to accommodate the passive elements. Second, to maintain a small substrate area, the passive elements are usually mounted in the vicinity of a singulation line. Therefore, if a substrate warps, passive elements can be damaged by the singulation blade due to relatively small tolerances between a body of the passive element and the singulation line, thus reducing manufacturing yield.

Second, since the passive elements are mounted on the periphery of the substrate, the substrate must be uniquely designed for a particular part due to the configuration of electrically conductive patterns. Further, a cover coat cannot be applied over the passive element locations during manufacture of the substrate, since the passive elements must be subsequently connected.

Third, if a semiconductor die is sensitive to interference, electromagnetic coupling from the passive elements to the semiconductor die is increased in the above-described design, reducing the electrical performance of the die and causing operational errors.

Finally, the semiconductor die is present during both the passive element mounting process and during the semiconductor package mounting process (in which the package including the passive element is mounted in an external device). The above-described process subjects the substrate and the semiconductor die to thermal stress in two different steps, increasing the tendency of the substrate and the semiconductor package to crack.

Therefore, it would be desirable to provide an improved semiconductor package including passive elements and manufacturing method therefor that reduces substrate area, eliminates the risk of damage during singulation, decreases electromagnetic interference between the passive elements and a semiconductor die and subjects the semiconductor die and substrate to less thermal stress during manufacture.

SUMMARY OF THE INVENTION

The above stated objectives are achieved in various assemblies and methods for packaging a semiconductor die in conjunction with passive elements. The assemblies include a substrate formed from a resin layer having electrically conductive patterns disposed on a top and a bottom surface, multiple passive elements connected to mounting pads forming part of the electrically conductive patterns near the center of the substrate, a semiconductor die mounted above the passive elements on the substrate, multiple conductive connectors for connecting the semiconductor die to the electrically conductive patterns and an encapsulation applied over the semiconductor die and conductive connectors.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1A:
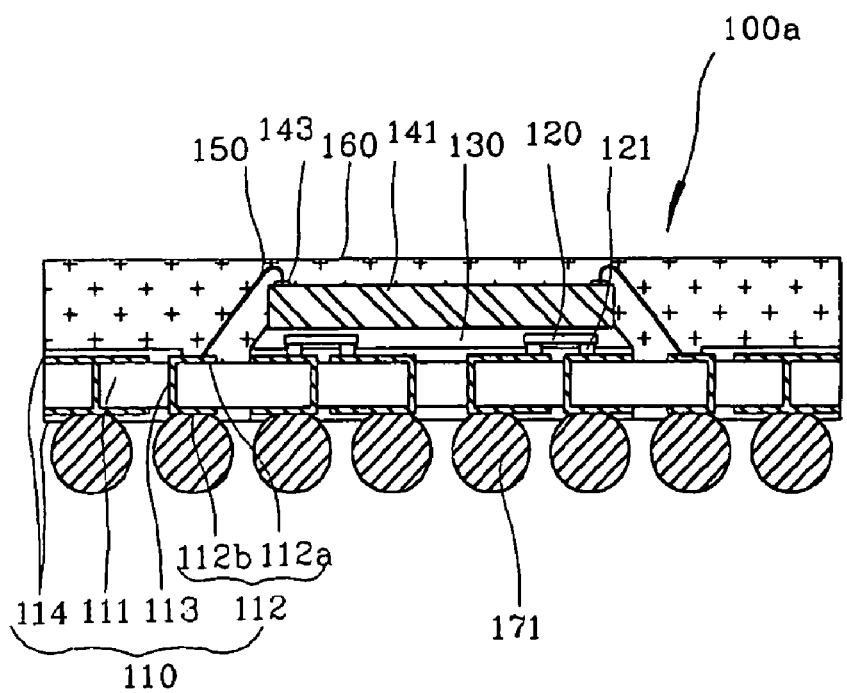
FIG. 1A is a sectional view illustrating semiconductor packages according to one embodiment of the present invention.
Figure 1B:
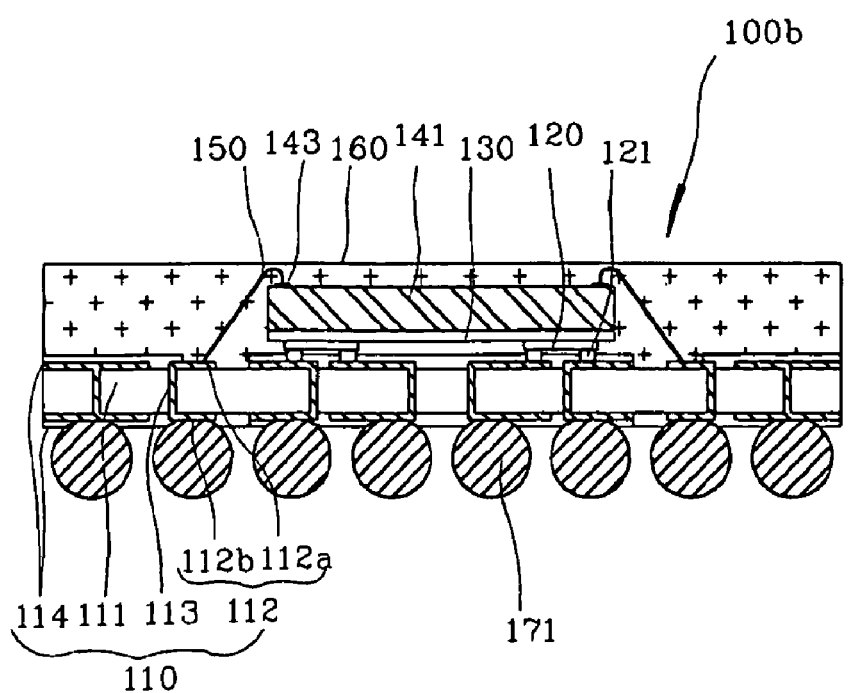
FIG. 1B is a sectional view illustrating semiconductor packages according to another embodiment of the present invention.

Referring to FIG. 1A and FIG. 1B, semiconductor packages 100a and 100b according to embodiments of the present invention are illustrated. As shown in the drawings, a substrate 110 of an planar plate including a resin layer 111 and a plurality of electrically conductive patterns 112 formed on the top and bottom surfaces of the resin layer 111 are provided. The substrate may be a printed circuit board, circuit tape or circuit film or similar structure. Therefore, when this specification is uses the term printed circuit board, it should be understood to mean a substrate such as those mentioned above.

Substrate 110 includes resin layer 111 and electrically conductive patterns 112 formed on the top and bottom surfaces of resin layer 111. Electrically conductive patterns 112 on the top surface of resin layer 111 and electrically conductive patterns 112 on the bottom surface of the resin layer 111 are electrically connected to each other by a plurality of electrically conductive vias 113. Also, electrically conductive patterns 112 on the top surface of resin layer 111 include bond fingers 112a which are connected to conductive connectors 150 as described below. Electrically conductive patterns 112 on the bottom surface of the resin layer 111 include ball lands 112b to which conductive balls 171 as described below are fused. The surface of conductive circuit patterns 112 (with the exception of bond fingers 112a and ball lands 112b) is coated with a insulating layer 114, thereby protecting the conductors from the external environment. However, the passive element mounting region is not coated with the insulating layer 114.

Passive elements 120 are located at the center of the top surface of substrate 110. Passive element 120 is electrically connected to electrically conductive patterns 112 formed on the central area of the top surface of the substrate 110. Passive elements 120 are connected to the electrically conductive patterns in a SMT (Surface Mount Technology) manner using solder 121. The passive elements may also be connected in a THT (Through Hole Technology) manner and the present invention is not limited to any specific form of passive component mounting.

A semiconductor die 141 having a plurality of bond pads 143 formed on its top surface is bonded to the top surface of the passive elements 120 by an adhesive 130. Passive element 120 is thereby located at the region corresponding to the bottom surface of the semiconductor die 141. Adhesive 130 may be one of a nonconductive epoxy, a nonconductive polyimide, a nonconductive double-faced adhesive tape or its equivalent. The present invention is not limited to the use of any particular adhesive material.

A nonconductive epoxy or nonconductive polyimide is used for adhesive 130 in the semiconductor package 100a as shown in FIG. 1A. A nonconductive double-faced adhesive tape is used for adhesive 130 in the semiconductor package 100b as shown in FIG. 1B. When epoxy or polyimide are used for adhesive 130, the semiconductor die 141 is bonded after the epoxy or polyimide is applied in the shape of dots or linear patterns to the region where passive elements 120 are located. When a double-faced adhesive tape is used, each semiconductor die is cut from a wafer after the double-faced adhesive tape is bonded to one surface of the wafer during the wafer mounting process. The sawed semiconductor die including double-faced adhesive tape attached to the bottom surface is then bonded to the top surface of passive elements 120. Use of double-faced adhesive tape can effectively prevent delamination at the interface between the passive elements and the semiconductor die that may occur when using the epoxy or polyimide in addition reducing electrical interference between passive elements 120.

Bond pads 143 of semiconductor die 141 and bond fingers 112a of electrically conductive patterns 112 are electrically connected by a conductive connector 150. Conductive connector 150 may be one of a gold wire (Au wire), an aluminum wire (Al wire) or an equivalent and the present invention is not limited to use of any particular conductive connector material. Finally, the top surface of the substrate 110 as well as semiconductor die 141 and conductive connectors 150 are encapsulated by an encapsulant in order to protect them from the external environment. Here, the encapsulating region is defined as an encapsulating portion 160. The encapsulant may be any one of an epoxy molding compound, a liquefied glob top or an equivalent, and again the present invention is not limited to a particular encapsulating material. After encapsulation, a plurality of conductive balls 171 such as solder balls are fused to the lands of electrically conductive patterns 112 on the bottom surface of the substrate 110 to permit the semiconductor package to be connected to a external device.

Therefore, there is no need to increase the area of substrate 110 as in the prior art to accommodate the passive elements 120, resulting in a miniaturization of the semiconductor package by the techniques of the present invention. Further, passive elements 120 will not contact the blade during singulation in the manufacturing process, preventing damage to the passive elements.

Further, the passive elements 120 are mounted in a concentrated arrangement within the central area of the top surface of substrate 110, and as a result electrically conductive patterns 112 can be more easily designed.

Figure 2A:
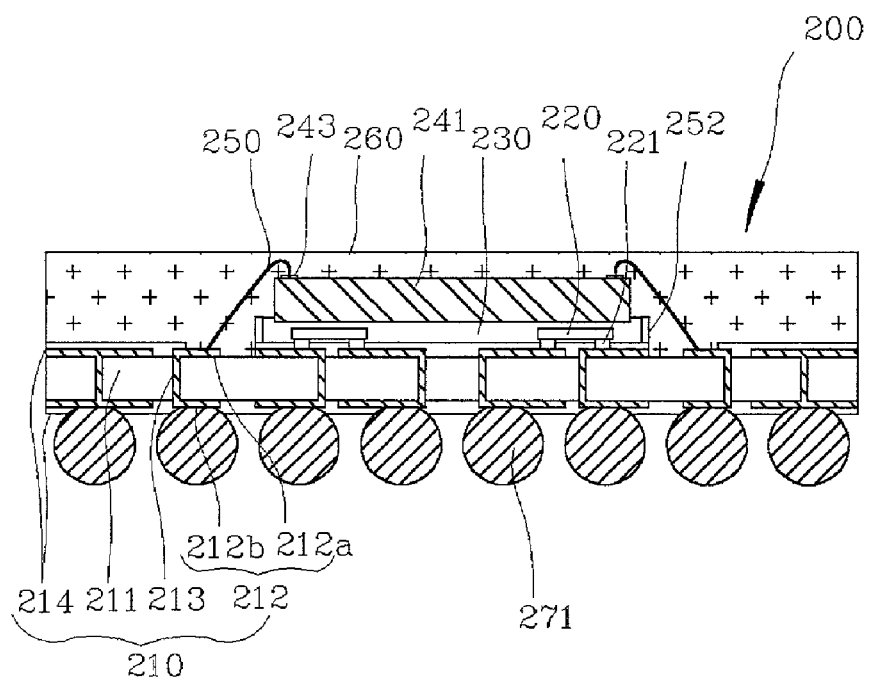
FIG. 2A is a sectional view illustrating semiconductor package according to another embodiment of the present invention.
Figure 2B:
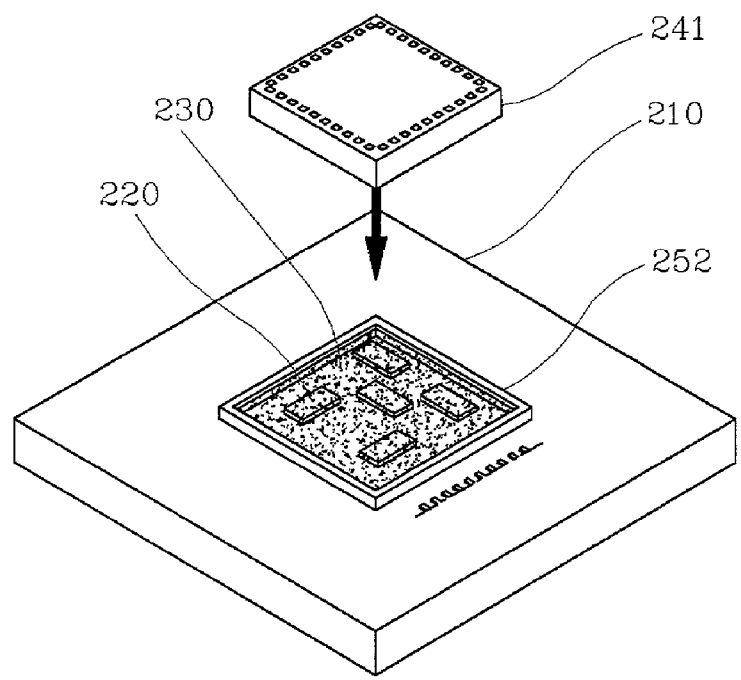
FIG. 2B is a perspective view illustrating a state of the semiconductor package of FIG. 2A before forming the encapsulating portion.

Referring now to FIG. 2A and FIG. 2B, a semiconductor package 200 according to another embodiment of the present invention is illustrated. Since semiconductor package 200 as shown in FIGS. 2A and 2B is similar to the semiconductor packages 100a and 100b of FIGS. 1A and 1B, only differences between the embodiments will be described in detail below.

As shown in the drawings, a dam 252 which has a height greater than the maximum height of passive element 220 further formed on the top surface of the substrate at the circumference of passive elements 220. Dam 252 prevents adhesive 230 overflow and also reduces electromagnetic interference that emanates from the passive elements. It is preferred that dam 252 be made of nonconductive materials. Further, dam 252 is larger than semiconductor die 241 and surrounds the sides of semiconductor die 241. Adhesive 230 located at the inside of the dam 252 may be any one of a nonconductive epoxy, a nonconductive polyimide, a nonconductive double-faced adhesive tape or an equivalent and the present invention is not limited to the use of a particular adhesive.

Semiconductor package 200 of the present invention as shown in FIG. 2A and FIG. 2B has all of the advantages as the embodiments depicted in FIG. 1A and FIG. 1B. Also, in the case of using the semiconductor die that is sensitive to interference, interference emanating from the passive elements is minimized, thereby preventing reduction of performance of the semiconductor die as well potential operational error.

Figure 3A:
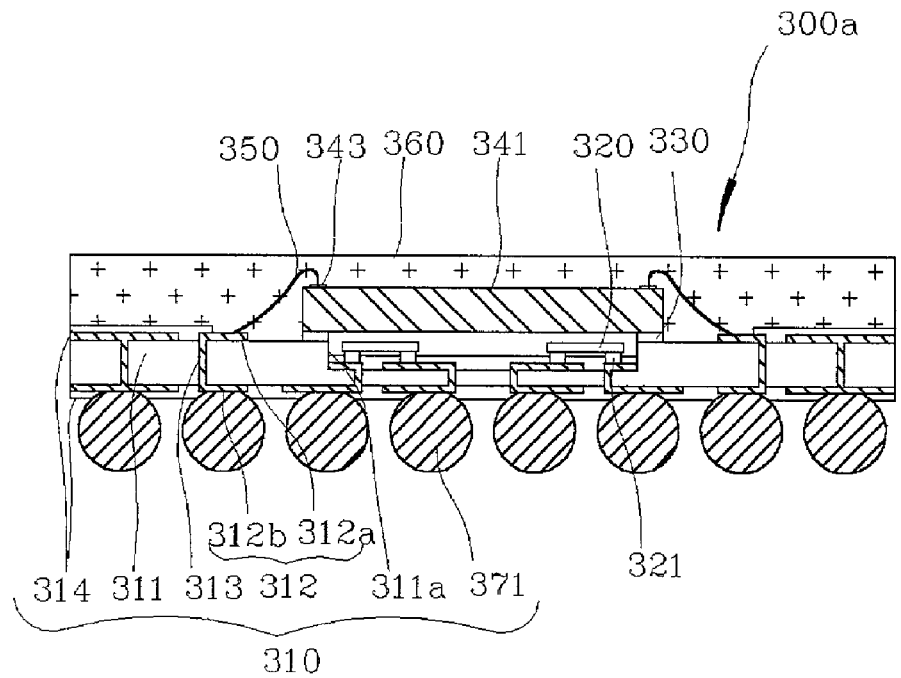
FIG. 3A is a sectional view illustrating semiconductor packages according to another embodiment of the present invention.
Figure 3B:
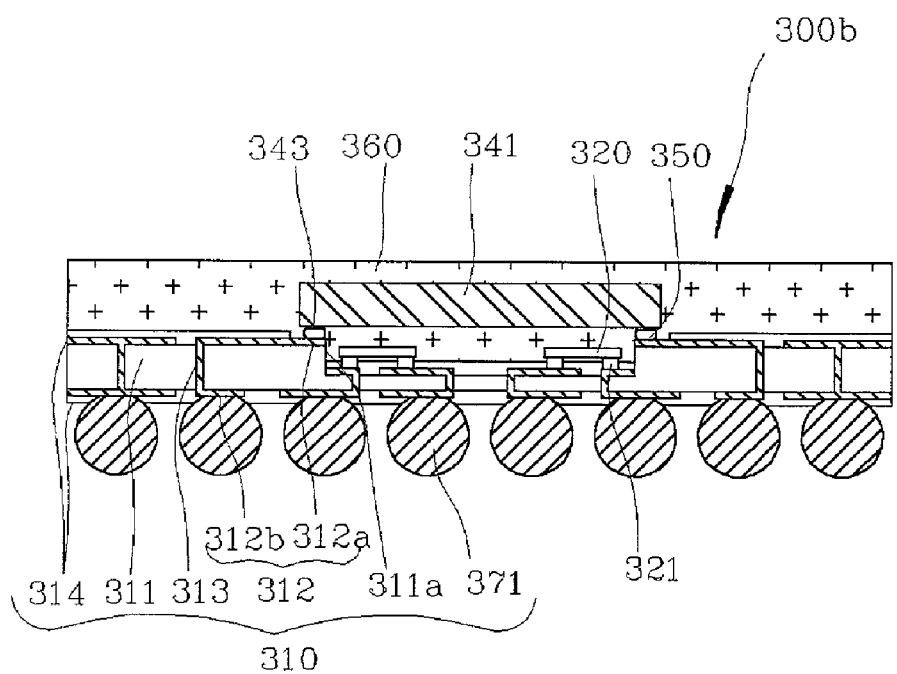
FIG. 3B is a sectional view illustrating semiconductor packages according to another embodiment of the present invention.

Referring next to FIG. 3A and FIG. 3B, semiconductor packages according to another embodiment of the present invention are illustrated. As the semiconductor packages as shown in FIG. 3A and FIG. 3B are similar to semiconductor packages 100a and 100b of FIG. 1A and FIG. 1B, only differences between the embodiments will be described in detail below.

A recess 311a having a predetermined depth smaller than the height of semiconductor die 341 is formed in the central area of the top surface of a substrate 310. Electrically conductive patterns 312 are formed at the bottom of recess 311a and passive elements 320 are connected to the electrically conductive patterns 312 formed in the bottom of recess 311a. Passive elements 320 can be connected in a SMT or THT manner and it is preferred that the thickness of the passive element 320 is offset by the depth of recess 311a. Moreover, it is preferred that the top surface of the passive element 320 does not contact the bottom surface of semiconductor die 341. Semiconductor die 341 is bonded to the top surface of substrate 310 at the circumference of the recess 311a by an adhesive 330. In the present embodiment, encapsulant does not enter the inside of recess 311a. Since the semiconductor die 341 is bonded to the upper part of the recess 311a by adhesive 330 such as a nonconductive epoxy, a nonconductive polyimide, a nonconductive double-faced adhesive tape or an equivalent, the encapsulant does not fill the inside of the recess 311a during the encapsulating process.

As shown in FIG. 3B, conductive bumps can be used as a conductive connector 350 for connecting semiconductor die 341 to bond fingers 312a of electrically conductive patterns 312. In the depicted embodiment, semiconductor die 341 is connected to substrate 310 in a flip die manner. After conductive bumps are formed at bond pads 343 of semiconductor die 341, the conductive bumps are connected to electrically conductive patterns 312 by turning the semiconductor die 341 bond pad side down. In the above-described embodiment, encapsulating portion 360 reaches the inside of recess 311a, as the conductive bumps do not completely block the flow of encapsulant. When using the flip die method described above, since the loop height of conductive connector 350 as shown in FIG. 3A is eliminated, semiconductor package 300b can be made thinner than semiconductor package 300a.

Figure 4:
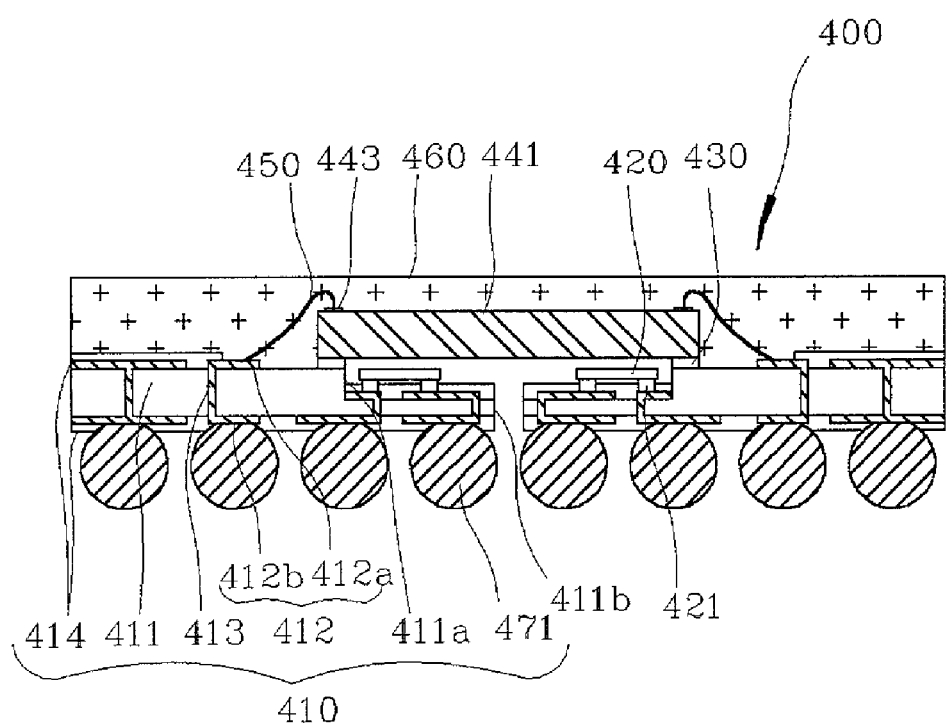
FIG. 4 is a sectional view illustrating semiconductor packages according to another embodiment of the present invention.

Referring next to FIG. 4, a semiconductor package 400 according to another embodiment of the present invention is illustrated. Since the semiconductor package shown in FIG. 4 is similar to semiconductor packages 300a and 300b of FIG. 3A and FIG. 3B, only differences between the embodiments will be described in detail below.

As shown in FIG. 4, an aperture 411b having a predetermined diameter or size can be further formed passing through the bottom surface of recess 11a to the bottom surface of substrate 411b. Thermal transfer of the package is improved as a result of air circulation to semiconductor die 441 and passive elements 420 from the outside. Also, water can freely exit the package, preventing delamination at the interface between the semiconductor die 441 and substrate 411b and cracking of the semiconductor die 441 or the passive elements 420 due to steam (popcorn effect).

Figure 5:
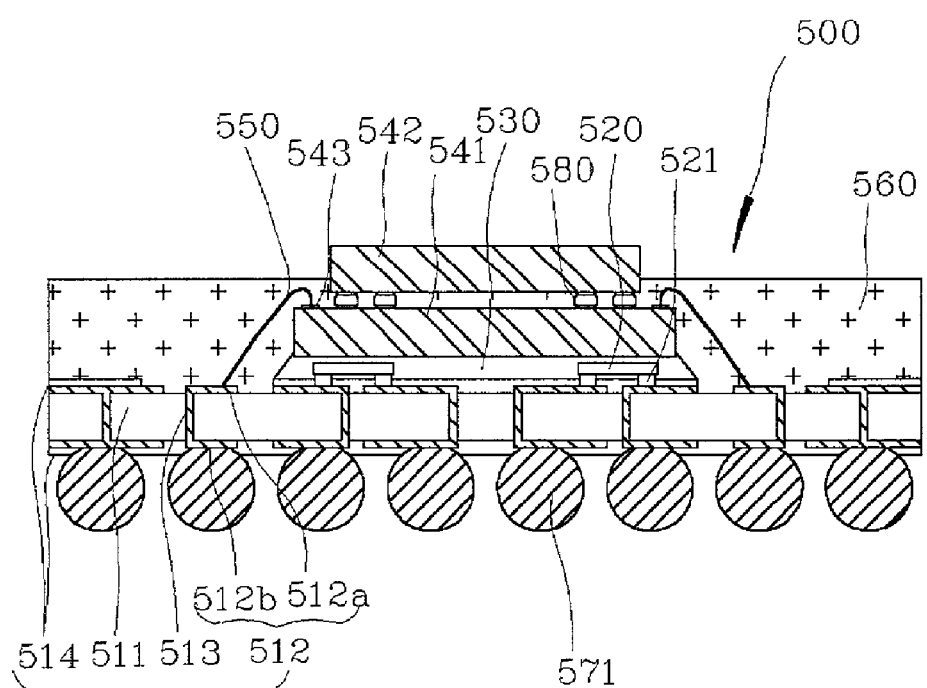
FIG. 5 is a sectional view illustrating semiconductor packages according to another embodiment of the present invention.

Referring now to FIG. 5, a semiconductor package 500 according to another embodiment of the present invention is illustrated. Since semiconductor package 500 as shown in FIG. 5 is similar to semiconductor packages 100a and 100b of FIG. 1A and FIG. 1B, only differences between the embodiments will be described in detail below.

As shown in FIG. 5, a first semiconductor die 541 is connected with a second semiconductor die 542 in a flip die arrangement. A stack type semiconductor package is thereby implemented so that first semiconductor die 541 and second semiconductor die 542 are electrically interconnected through a bump bond 580 which is formed at a specific bond pad 543 of first semiconductor die 541 or second semiconductor die 542. This feature can be applied to all embodiments of the present invention. The top surface of second semiconductor die 542 and a part of the side surface of the second semiconductor die 542 are exposed to outside air, improving the thermal transfer performance of the package. Function and efficiency of the semiconductor package are improved by stacking the semiconductor dies.

Figure 6:
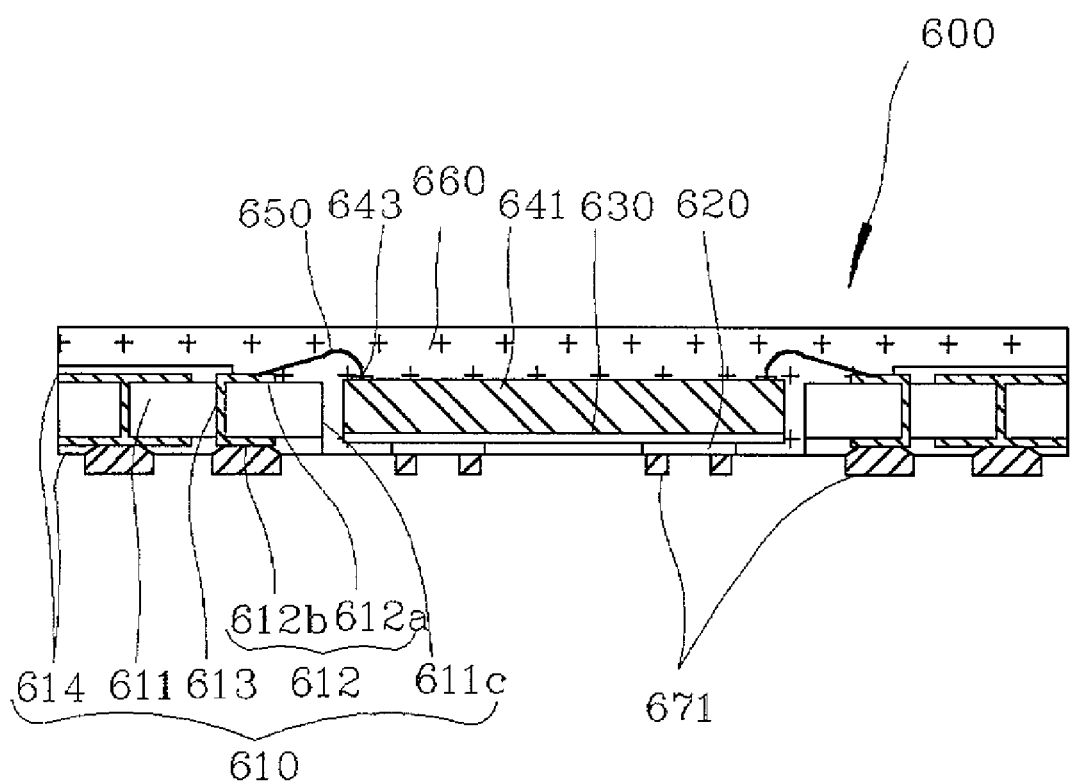
FIG. 6 is a sectional view illustrating semiconductor packages according to another embodiment of the present invention.

Referring next to FIG. 6, a semiconductor package 600 according to another embodiment of the present invention is illustrated. As shown in the drawing, a substrate 610 including a resin layer 611 having an aperture 611c formed at its center and a plurality of electrically conductive patterns 612 formed on the top and bottom surfaces of the resin layer is provided. Substrate 610 may be a printed circuit board, circuit tape or circuit film and or the like as described above.

A plurality of passive elements 620 are mounted inside the aperture 611c of the substrate 610. A semiconductor die 641 is bonded to the top surfaces of passive elements 620 by an adhesive 630 such as double-faced adhesive tape. Bond pads 643 of semiconductor die 641 and bond fingers 612a of electrically conductive patterns 612 are electrically connected to each other by the conductive connectors 650. Aperture 611c, passive elements 620, semiconductor die 641 and conductive connectors 650 are encapsulated by an encapsulant to form an encapsulation 660. In the depicted embodiment, the bottom surface of passive element 620 is exposed to the outside of the encapsulating portion 660.

Finally, conductive balls 671 (such as solder balls) are fused to lands 612b of electrically conductive patterns 612 on the bottom surface of substrate 610 and also to the bottom surface of passive elements 620 where exposed to the outside of the encapsulating portion 660 to provide connection to an external device. Passive elements 620 are not connected to electrically conductive patterns 612 but instead are directly connected to electrically conductive patterns of an external device. The depicted embodiment provides a mounting region for passive elements 620 connected to an external device but located within semiconductor package 600, thereby greatly increasing the mounting density of the semiconductor die/passive element combination.

Also, fabrication of an assembly including semiconductor package 600 and passive elements 620 can be accomplished more efficiently as all of the above-mentioned components and be installed in one step, with the additional benefit of minimizing thermal stress induced in substrate 610, reducing the risk of cracking the semiconductor package.

Figure 7A:
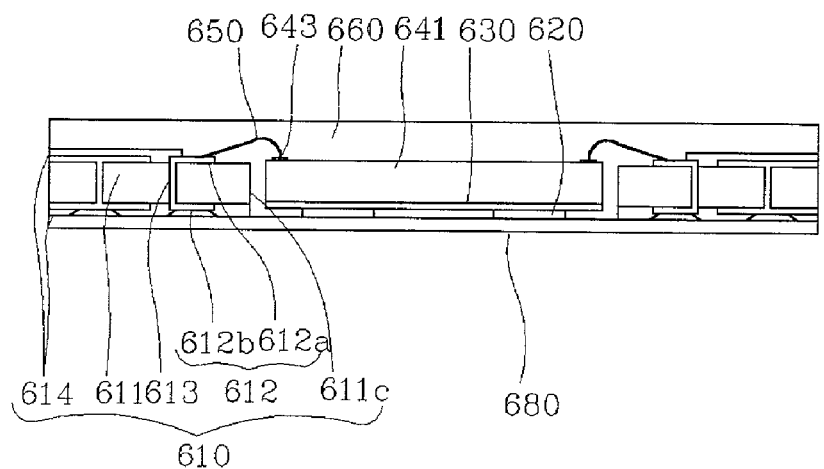
FIG. 7A through FIG. 7C are sectional views respectively illustrating a sequence of steps which may be employed for manufacturing the semiconductor package of FIG. 6.
Figure 7B:
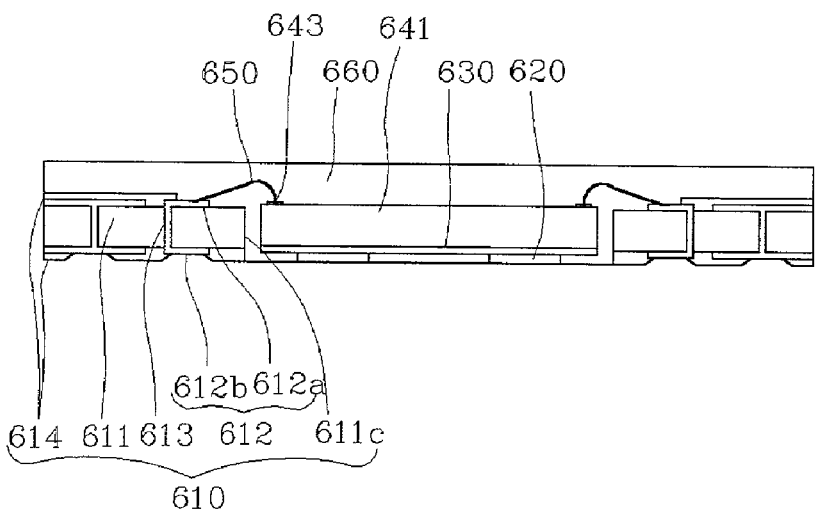
Figure 7C:
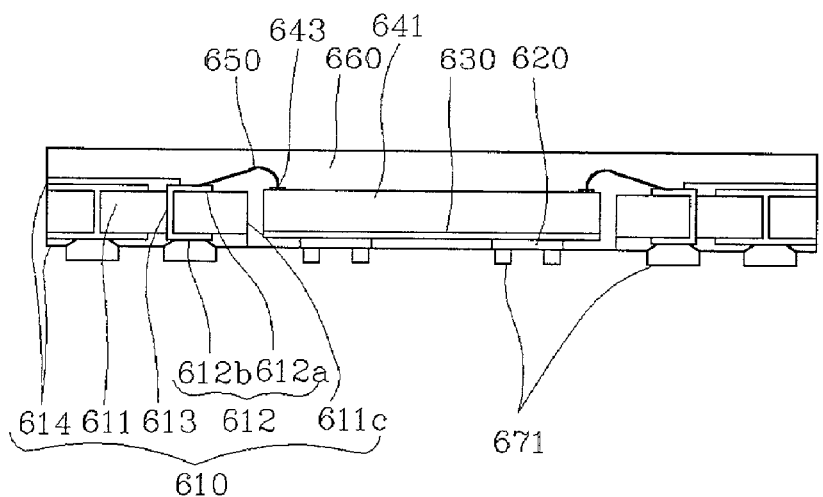

Referring to FIG. 7A through FIG. 7C, sectional views of one method for manufacturing one embodiment of the present invention are illustrated. The method according to the present invention will be described in a stepwise manner with reference to FIGS. 7A through 7C.

As shown in FIG. 7A, an adhesive tape 680 is bonded to one surface of substrate 610 in which aperture 611c is formed. Then, passive elements 620 are arrayed on a region of adhesive tape 680 inside aperture 611c.

Next, semiconductor die 641 is bonded to the top surface of passive elements 620 using adhesive 630. Then, aperture 611c of substrate 610, semiconductor die 641 and conductive connectors 650 are encapsulated by an encapsulant to form encapsulation 660, after semiconductor die 641 and the electrically conductive patterns 612 are electrically connected to each other by conductive connector 650.

Next, as shown in FIG. 7B, adhesive tape 680 is removed from the substrate 610, so that the bottom surface of passive element 620 is exposed to the outside of the encapsulation 660.

Referring now to FIG. 7C, after fabrication of the package, conductive balls 671 are fused to lands 612b of electrically conductive patterns 612 on the bottom surface of substrate 610 and bottom surface of passive elements 620 to complete fabrication of the semiconductor package 600.

Therefore, according to the embodiments of the present invention and despite using the substrate having a relatively small area, a number of passive elements can be mounted on the substrate, thereby reducing circuit size and minimizing damage to the passive elements during the fabricating process (for example, damage occurring during the singulation process).

Further, the passive elements are mounted in a concentrated manner at the central area of the top surface of substrate 610, facilitating design of the electrically conductive patterns and improving the yield of the semiconductor package. Moreover, when using a semiconductor die sensitive to interference, a closure member (for example, a nonconductive adhesive and dam) is formed around the passive elements, thereby averting reduction in electric performance of the die and operational errors in the die. Efficiency and functionality of the semiconductor package may further be increased by stacking the semiconductor dies and interconnection and mounting of the semiconductor package requires one less step, reducing the risk of cracking the semiconductor package and passive elements.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a substrate having a plurality of electrically conductive patterns formed on a surface thereof wherein the substrate defines an aperture therein;
   at least one passive element mounted within the aperture;
   a semiconductor die mounted within the aperture and above the at least one passive element, whereby the semiconductor die is mechanically secured above a top surface of the at least one passive element without electrical connection between any electrical terminal of the semiconductor die and an electrical terminal of the at least one passive element, and wherein said semiconductor die is mechanically secured by an adhesive layer contacting the top surface of the at least one passive element and a bottom surface of the semiconductor die;
   a plurality of conductive connectors for electrically connecting electrical connections of the semiconductor die to the electrically conductive patterns; and
   an encapsulation disposed on the top surface of the substrate, covering the semiconductor die and the conductive connectors and wherein the at least one passive element has a bottom surface conformal to a bottom surface of the encapsulant whereby electrical connections to the at least one passive of conductive connectors for electrically element are exposed.

2. The semiconductor package of claim 1, wherein the substrate comprises a resin layer and the electrically conductive patterns are formed on a top and a bottom surface thereof.

3. The semiconductor package of claim 2, further comprising a plurality of conductive balls fused to the electrically conductive patterns formed on the bottom surface of the substrate, whereby the semiconductor package may be electrically connected to an external device.

4. The semiconductor package of claim 1, wherein said adhesive layer is a non-conductive adhesive layer, whereby the at least one passive element and the semiconductor die are mechanically bonded together, and whereby the at least one passive element supports the semiconductor die.

5. The semiconductor package of claim 4, wherein the adhesive layer comprises of one of a nonconductive epoxy, a nonconductive polyimide or a nonconductive double-faced adhesive tape.

6. The semiconductor package of claim 1, wherein the conductive connectors are conductive bumps, wherein the die includes bond pads on the bottom surface of the die and wherein the die is mounted by bonding the conductive bumps to the bond pads.

7. The semiconductor package of claim 1, wherein the top surface of the semiconductor die includes bond pads on a top surface of the semiconductor die and wherein the semiconductor die is electrically connected to another semiconductor die by conductive bumps bonded between the bond pads and the second semiconductor die.

8. A semiconductor package, comprising:
   a semiconductor die;
   a substantially planar substrate having a plurality of electrically conductive patterns formed on a surface thereof, wherein the substrate defines an aperture having a predetermined size greater than the size of the semiconductor die, and wherein the semiconductor die is mounted within the aperture;
   at least one passive element mounted within the aperture underneath the semiconductor die, whereby the semiconductor die covers the at least one passive element in a direction perpendicular to the plane of the substrate without electrical connection between any electrical terminal of the semiconductor die and an electrical terminal of the at least one passive element;
   a plurality of conductive connectors for electrically connecting electrical connections of the semiconductor die to the electrically conductive patterns; and
   an encapsulation disposed on the top surface of the substrate, covering the semiconductor die and the conductive connectors, and wherein the at least one passive element has a bottom surface conformal to a bottom surface of the encapsulant whereby electrical connections to the at least one passive element are exposed.

9. The semiconductor package of claim 8, wherein the encapsulant fills the aperture, mechanically bonding the semiconductor die and the at least one passive element to the substrate.

10. The semiconductor package of claim 8, further comprising a plurality of conductive balls fused to the electrically conductive patterns formed on the bottom surface of the substrate, whereby the semiconductor package may be electrically connected to an external device and a second plurality of conductive balls fused to the exposed electrical connections of the at least one passive element.

11. A semiconductor package, comprising:
- a substrate having a plurality of electrically conductive patterns formed on a surface thereof and defining an aperture;
- at least one passive element mounted within the aperture;
- a semiconductor die mounted within the aperture;
- a plurality of conductive connectors for electrically connecting electrical connections of the semiconductor die to the electrically conductive patterns;
- an encapsulation disposed on the top surface of the substrate, covering the semiconductor die and the conductive connectors wherein the at least one passive element has a bottom surface conformal to a bottom surface of the encapsulant whereby electrical connections to the at least one passive of conductive connectors for electrically element are exposed;
- means for mounting the semiconductor die to the at least one passive element, whereby the at least one passive element is located underneath the semiconductor die; and
- means for providing electrical connection to the at least one passive element, exclusive of electrical connection with any terminal of the semiconductor die.

12. The semiconductor package of claim 11, wherein the means for electrically connecting the at least one passive element comprises means for electrically connecting the at least one passive element to an external device.

13. The semiconductor package of claim 11, wherein the means for mounting the at least one passive element beneath the semiconductor die further comprises means for mechanically bonding the at least one passive element to the semiconductor die.

* * * * *